United States Patent [19]

Tei

[11] Patent Number: 4,829,353
[45] Date of Patent: May 9, 1989

[54] PHOTOELECTRIC CONVERTING DEVICE
[75] Inventor: Sadahiro Tei, Ebina, Japan
[73] Assignee: Fuji Xerox Co., Ltd., Tokyo, Japan
[21] Appl. No.: 723,086
[22] Filed: Apr. 15, 1985
[30] Foreign Application Priority Data Apr. 18, 1984 [JP] Japan ................................ 59-77989

[51] Int. Cl.4 ...................... H01L 27/14; H01L 31/00
[52] U.S. Cl. ..................................................... 357/30
[58] Field of Search ........................... 357/30, 2, 15, 52

[56] References Cited
U.S. PATENT DOCUMENTS

| | | | |
|---|---|---|---|
| 3,946,427 | 3/1976 | Iwasawa et al. | 357/72 |
| 4,471,371 | 9/1984 | Hamano | 357/2 |
| 4,520,382 | 5/1985 | Shimura | 357/49 |
| 4,527,007 | 7/1985 | Fuse | 357/30 |

Primary Examiner—William L. Sikes
Assistant Examiner—Georgia Y. Epps
Attorney, Agent, or Firm—Handal & Morofsky

[57] ABSTRACT

A photoelectric converting device in which a photoelectric converting part is covered directly with a passivation film made of a silicone resin. The passivation film is made by directly applying on the photoelectric converting part a mixture of silicone base polymer having a number-average molecular weight of 6000 to 9000 and a weight-average molecular weight of 30000 to 40000, and silicone oligomer having a molecular weight of 600 to 1500, and then by heating the mixture at a low temperature for its hardening.

5 Claims, 3 Drawing Sheets

PHOTOELECTRIC CONVERTING DEVICE

BACKGROUND OF THE INVENTION

1. Field of the Invention

The present invention relates to a photoelectric converting device and a fabricating method therefor, and more specifically, to a photoelectric converting device which comprises a passivation film made of silicone resin directly covering a photoelectric converting part and to its method of fabrication.

2. Description of the Prior Art

These years attention has been directed to amorphous semiconductors, because they, as industrial materials, have excellent processing characteristics and mass-productivity and are low in cost. Further they have such a sensitive structure that their physical property constants can be continuously varied by controlling the composition of elements in forming the semiconductor material.

For example, since an image sensor employing a Schottky photoelectric converting element in which amorphous silicon is used as its photoconductive layer has a good light response characteristic (having a light-/dark current ratio of more than $10^4$), it is effectively utilized as an excellent direct contact type image sensor.

FIGS. 1(a) and 1(b) respectively show cross sectional views of planar image sensors. More specifically, an image sensor 10 shown in FIG. 1(a) comprises opaque opposing electrodes 12 and 13 provided on a substrate 11 spaced by a predetermined distance, a photoconductive layer 14 formed on the electrodes 12 and 13, and a passivation film 15 formed on the photoconductive layer 14. The image sensor 10 receives a light from the side of the substrate 11 as shown by an arrow La. An image sensor 20 shown in FIG. 1(b), on the other hand, comprises a photoconductive layer 22 formed on a substrate 21, opaque opposing electrodes 23 and 24 provided on the layer 22 spaced by a predetermined distance, and a passivation film 25 covering the opposing electrodes 23 and 24. The sensor 20 receives a light from the side of the passivation film 25 as shown by an arrow Lb.

Referring to FIG. 1(c) and 1(d), there are shown, in section, image sensors of sandwich type. More particularly, an image sensor 30 shown in FIG. 1(c) comprises a transparent lower electrode 32 formed on a substrate 31, a photoconductive layer 33 formed on the electrode 32, an upper electrode 34 formed on the layer 33, and a passivation film 35 covering the upper electrode 34 and the layer 33. The image sensor 30 receives a light from the side of the substrate 31 as shown by an arrow Lc. On the other hand, an image sensor 40 shown in FIG. 1(d) comprises a lower electrode 42 formed on a substrate 41, a photoconductive layer 43 formed on the substrate 41 and lower electrode 42, a transparent upper electrode 44 formed on the layer 43, and a passivation film 45 covering the layer 43 and electrode 44. The image sensor 40 receives a light from a side of the passivation film 45 as shown by an arrow Ld.

Among the image sensors 10, 20, 30 and 40, the image sensors 10 and 30 which receive light from the substrate side requires that the substrate be made of a transparent material such as glass. The substrate also functions as a passivation film. The passivation film provided on the opposite side may be opaque and therefore the material and thickness of the passivation film is relatively widely selected.

On the other hand, the image sensors 20 and 40 receive light from the side of the passivation film and accordingly the passivation film must be transparent.

Usually, an inorganic film such as a silicon oxide ($SiO_x$) film formed by the plasma CVD or an inorganic film coated with macromolecular resin such as polyimide resin is used as the passivation film. However, when silicon oxide film is used, the Schottky junction of the sensor is often destroyed during formation of the silicon oxide film due to the high temperature required during the film formation. Especially, in the case of a sensor of sandwich structure in which a photoconductive layer is held between upper and lower electrodes, these two electrodes are likely to be short-circuited in the plasma environment by the plasma CVD. Further, when the inorganic film coated with macromolecular resin is used as the passivation film, the photoelectric converting part may be sometimes destroyed during the formation of the passivation film because the curing temperature of the resin itself is as high as 350°–400° C. That is, when the lower electrode in the sandwich type is made of, for example, chrome (chrome is often employed), the sensor characteristics will be often deteriorated during the formation of the polyimide resin film because chrome starts to oxidize at 250° C. Further, the polyimide resin does not have good optical characteristic. For example, the polymide resin absorbs lights whose wavelength is 480 nm or below. Furthermore, the low moisture and heat resistance properties in either case make it difficult to keep the image sensor stable with time without any deterioration of its characteristics.

Recently, there has been a tendency to elongate image sensors. Such elongated image sensors may be realized because an amorphous semiconductor having a large area can be easily formed. When the passivation film for the elongated image sensor is of a two-layer structure comprising an inorganic film and a polyimide resin film, it is difficult to uniformly form the inorganic film. Thus, the inorganic film is often subjected to cracking which reaches the polyimide resin film forming the upper layer, resulting in lowering of its moisture resistance.

As mentioned above, in either type of passivation film, it has been impossible to keep the image sensor stable for a long time without any deterioration of its characteristics.

In particular, when it is desirable to make such a photoelectric converting device formed on a large area substrate as an elongated image sensor, it has been impossible to make a passivation film which has good bonding and humidity resistance properties and can operate stably.

SUMMARY OF THE INVENTION

It is an object of the present invention to provide a photoelectric converting device which is stable with time even when its environmental conditions are changed.

It is another object of the invention to form a passivation film which can be bonded tightly and stably to a photoelectric converting device formed on a large area substrate.

To attain the above objects, a photoelectric converting device according to the present invention comprises photoelectric converting means having a photoconductive layer made of an amorphous semiconductor and at least two electrodes connected to the photoconductive layer, and a passivation film made of a silicone resin and covering directly the photoelectric converting means.

Further, to attain the above object, a method for fabricating a photoelectric converting device comprises the steps of forming a photoelectric converting means including a photoconductive layer made of an amorphous semiconductor and at least two electrodes connected to the photoconductive layer, directly applying a mixture of silicone base polymer having a number-average molecular weight of 6000 to 9000 and a weight-average molecular weight of 30000 to 40000 and silicone oligomer having a molecular weight of 600 to 1500 onto the photoelectric converting means, and heating and hardening the mixture.

According to the semiconductor device of the present invention, since its sensor part made of amorphous semiconductor is protected by coating it with a protective film made of an organic macromolecular resin, the semiconductor device will not be affected by such environmental conditions as the ambient temperature and humidity and thus will operate stably with time. Further, since the curing temperature of the passivation film is relatively low, the sensor part will not be susceptible to adverse influence during formation of the passivation film.

DESCRIPTION OF THE PREFERRED EMBODIMENT

Figure 1A:
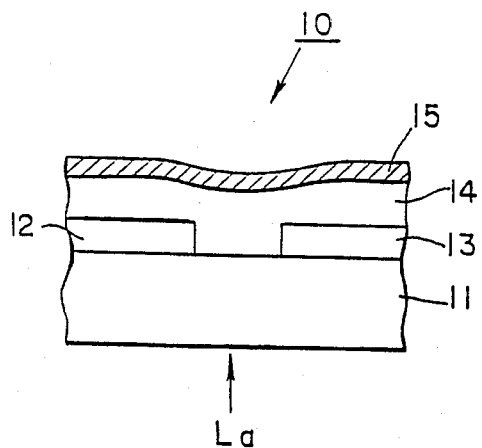
FIG. 1(a) to (d) show structures of examples of image sensors.
Figure 1B:
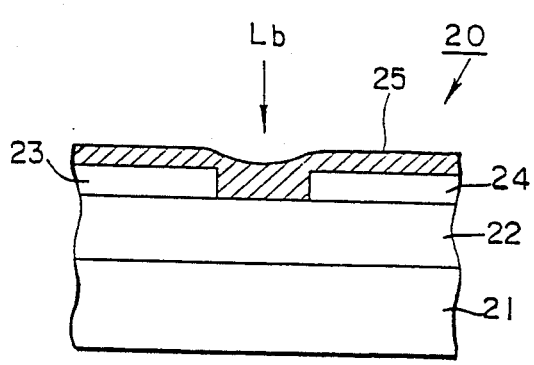
Figure 1C:
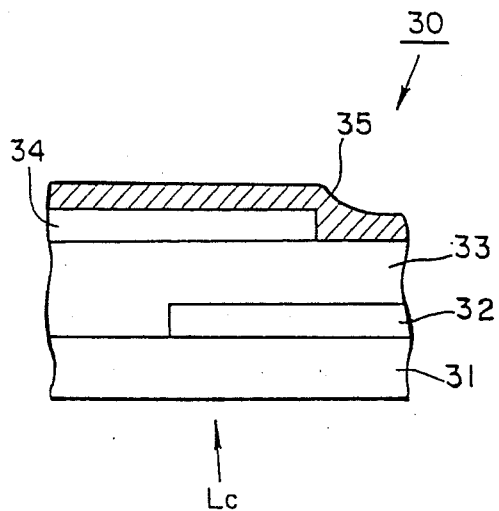
Figure 1D:
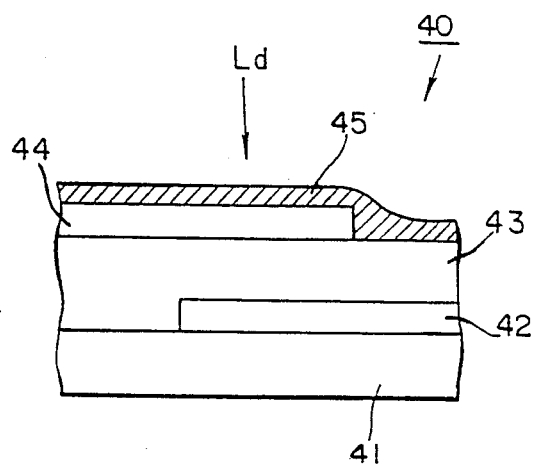
Figure 2:
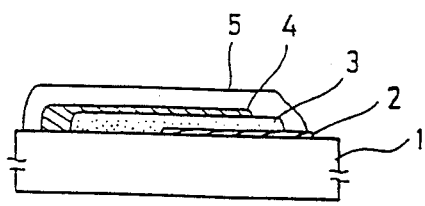
FIG. 2 is a cross sectional view of a Schottky image sensor in accordance with the present invention.
Figure 3:
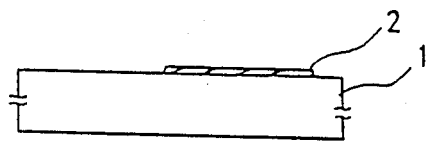
FIG. 3 to 6 show a manufacturing procedure of the Schottky image sensor.

Referring to FIG. 2, there is shown a cross sectional view of a Schottky image sensor in accordance with the present invention. The Schottky image sensor whose sensing part is of a sandwich structure. The sensing part is covered with a light-permeable passivation film 5 made of a silicone resin having a three-dimensional structure of polydimethyl siloxane

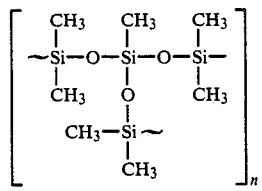

developed through the deoxime reaction. This sensing part comprises a chrome (Cr) electrode 2 of a predetermined divided pattern on an insulating glass substrate 1 which is marketed under the tradename of "Corning 7059", a hydrogenated amorphous silicon (a-Si:H) layer 3 formed on the chrome electrode 2 as a photoconductive layer, and an indium tin oxide (ITO) electrode 4 formed on the layer 3 as a common light-permeable electrode.

Next, explanation will be made as to how to fabricate the Schottky image sensor.

First, a thin chrome film of about 2000 to 3000 Å thick is formed on the insulating glass substrate 1 by an electron beam evaporation process and then shaped into the predetermined divided pattern chrome electrode 2 by photolithography as shown in FIG. 2.

Figure 4:
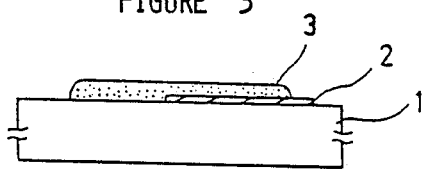

After this, the hydrogenated amorphous silicon layer 3 is deposited as shown in FIG. 4 on the resultant electrode 2 to be about 0.1 to 3 $\mu$m thick by the plasma CVD process. This deposition is carried out under such conditions that a 100% monosilane ($SiH_4$) gas is used as its operating gas, the operating pressure is between 0.1 and 1 Torr, the gas flow is between 10 and 100 sccm, the electric power is between 10 and 200 W, the substrate temperature is between 150° and 300° C. and the continuous deposition time is about 1 hours.

Figure 5:
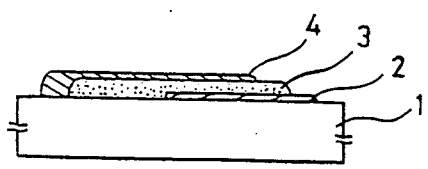

Subsequently, the indium tin oxide layer 4 as a light permeable electrode is formed as shown in FIG. 5 by a sputtering process under such conditions that its target is made of an indium tin oxide (90 mol % of indium oxide ($In_2O_3$) plus 10 mol % of tin oxide ($SnO_2$)), the oxygen partial pressure is between 0.5 and $1.5 \times 10^{-4}$ Torr, the power flux density is between 100 and 1000 mW/cm$^2$, and the substrate temperature is between 50° and 250° C.

Figure 6:
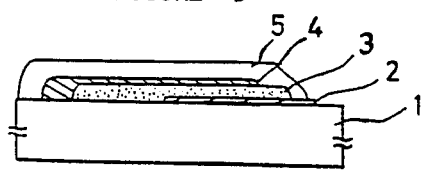

Finally, the aforementioned silicone resin is applied as shown in FIG. 6 on the layer 4 to be between 1 and 100 $\mu$m by a spin coating process, and subsequently heated and hardened for 60 minutes at an atmospheric temperature of 100° to 150° C. to thereby form the light-permeable passivation film 5.

The Schottky image sensor thus fabricated has a good electrical property while the property is not deteriorated during the formation of the passivation film. More specifically, the sensing part of the sensor is of air and water tight sealed by the passivation film, so that, even when affected by a change in such ambient conditions as environmental humidity and/or temperature, the sensor will not be subjected to, for example, cracking and thus can operate stably with time. Further, the passivation film can protect the sensor from stresses caused by friction, vibration and the like, from mechanical shock and from thermal shock.

Figure 7:
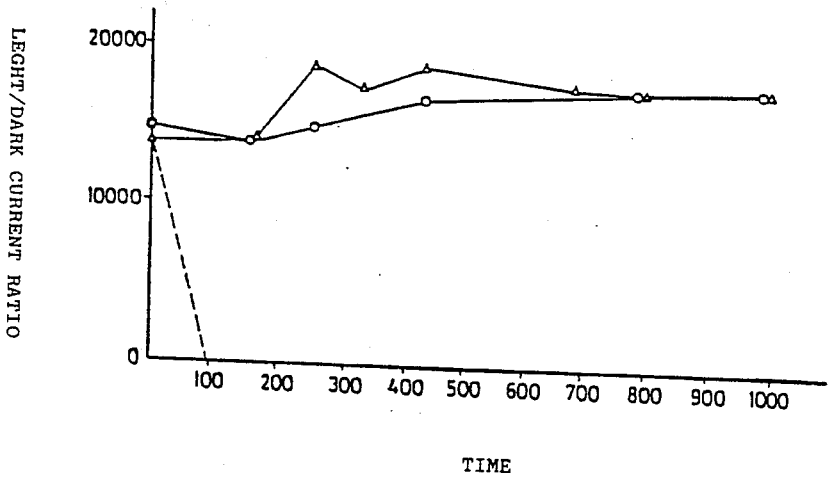
FIG. 7 is a graph showing results of moisture resistance tests for the sensor shown in FIG. 2 and for a prior art sensor.

A moisture vapor resistance test has been made on an amorphous silicon image sensor according to an embodiment of the present invention wherein a silicone resin is used as the passivation film, and the results are shown with a solid line in FIG. 7. That is, light/dark current ratio has been measured under an emvironmental condition of high humidity of 90% RH at 60° C. For comparison, on the other hand, the measuring results of a conventional amorphous silicon image sensor not provided with such passivation film are shown with a dotted line in FIG. 7. It will be seen from FIG. 6 that the prior art non-passivation-film provided sensor becomes deteriorated relatively fast in its electrical property, whereas the sensor of the present invention protected by the silicone resin can operate stably for 1000 hours at a high humidity of 90% RH at a temperature of 60° C. and for 100 hours at a high humidity of 100% RH at a high temperature of 121° C. The following table shows the results of a reliability estimation test for the amorphous silicon image sensor of the invention.

TABLE

Reliability Estimation Test Results for Amorphous Silicon Image Sensor

| Test Items | Test Conditions | | Results *1 | Remarks |
|---|---|---|---|---|
| | Condition | Time | | |
| Environmental Tests | | | | |
| High temp., high humi. exposure | 60° C., 90% RH | 500 H | OK | *2 |
| | | 1000 H | OK | |
| Low temp. exposure | −30° C. | 500 H | OK | *2 |
| Temp. cycle | −30° C.~RT~ +70° C. 30 min./step | 50 cycle | OK | *2 |
| | −40° C.~RT~ +85° C. 30 min./step | 50 cycle | OK | *2 |
| Thermal shock | −30° C.~+70° C. 30 min./step | 50 cycle | OK | *2 |
| Life Test | | | | |
| High temp., high humi. operation | 60° C., 90% RH operation | 1500 H | OK | *3 |
| Mechanical Test | | | | |
| Variable freq. vibration | 10~55~10 Hz, 1 minute/cycle Amplitude 1.5 mm, Time Three directions Each 2 H | | OK | *3 |

Notes
*1 the criterion is to meet the respective specifications of "amorphous Silicon Image Sensor Characteristic Specification" with respect to "Saturation Output", "light Output Irregularity", "Dark Output" and "Current Consumption".
*2 Leaving Image Sensor without connector and plate.
*3 Estimation in the end of driving test.

The Schottky image sensor is very good in its protective property, because the light-premeable upper electrode which is the integrally formed indium tin oxide layer covers the hydrogenated amorphous silicon layer which is the photoconductive layer and the passivation film made of a silicone resin is provided in the upper electrode, and therefor because its Schottky junction is substantially of a two-layer structure comprising an inorganic film (indium tin oxide) and an organic film (silicone resin film).

Further, since the silicone resin have a low curing temperature is provided directly on the Schottky image sensor, it is possible to form the passivation film tightly on the sensor without causing any deterioration of the characteristics of the sensor.

Furthermore, the silicone resin is rich in repellency against water because its methyl groups are hydrophobic groups are oriented outside, and is impermeable to water because it contains less unreacted groups.

In addition, since Si—O bondings in the silicone resin are oriented inside, that is, toward the photoelectric converting part, a reaction will take place at interfaces between the silicone resin and the ITO and amorphous hydride layers, which results in that the resin will be adhered or bonded highly tightly to the photoelectric converting part.

Silicone base polymer and silicone obligomer comprised of the silicone resin are selected respectively to have a number-average molecular weight of 6000 to 9000 (preferably, 7000 to 8000) and a weight-average molecular weight of 30000 to 40000 (preferably, 31000 to 40000) and have a molecular weight of 600 to 1500. Therefore, the silicone resin can have a high bonding strength to the photoelectric converting part. When the silicone base polymer and silicone obligomer each having an unevenly distributed molecular weight are used, the silicone resin will be reduced in bonding property.

Further, the silicone obligomer is a mixture of 35 to 50% of two-functional-group compound

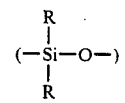

(that is, having a silicon linked to two function groups) and three-functional-group compound, and therefore the bonding property of the resultant silicone resin is good to the photoelectric converting part. When the silicone oligomer contains 35% or less of the two-functional compound, the resultant silicone resin will become hard, resulting in its easy cracking generation and bad bonding property. When the silicone oligomer contains 55% or more of the two-functional compound, on the other hand, the resultant resin will become too soft and weak.

Since the curing conditions of the silicone resin are set to be between 100° and 150° C. for 1 hour, the generation of internal stresses within the resin can be suppressed and its photoelectric conversion characteristic cannot be deteriorated. Although the intended object can be achieved under such a during condition of a temperature of 100° to 300° C. for a time of 5 to 120 minutes, it is desirable to set to be between 100° and 150° C. for 60 minutes.

As a photoelectric converting device is made large in size, it has been so far highly difficult to make uniformly a passivation film having a good bonding property and thus it has been impossible to form a passivation film having a high reliability. The present invention is not restricted to the image sensor of sandwich structure but valid for image sensors of all the structures shown in FIG. (a) to (d). According to the present invention, it is possible to make a highly effective passivation film, in particular, for such a large-sized photoelectric converting device as an elongated image sensor or a large-sized position sensitive detector.

Though passivation film has been provided by the spin coating process in the aforementioned embodiment, the present invention is not limited to this process but it is possible to favourably make the passivation film uniformly over a wide area by such a process as roll coating, spray coating, dipping, potting casting, sealing and drip coating processes.

What is claimed is:

1. In a photoelectric converting device comprising photoelectric converting means a photoelectric converting element of a sandwich structure in which the photoconductive layer is sandwiched by a layer electrode formed on a substrate and a light-permeable upper electrode, said light permeable upper electrode and said photoconductive layer forming a Schottky junction therebetween and a passivation film directly covering said photoelectric converting means, the improvement comprising said passivation film having a thickness between 1 and 100 μm, and being formed by heating and hardening a mixture of silicone base polymer having a number-average molecular weight of 6000 to 9000 and a weight-average molecular weight of 30,000 to 40,000 and silicon oligomer having a molecular weight of 6,700 to 1,500.

2. A photoelecrtric conveting device as set forth in claim 1, wherein each of said silicon polymer and silicon oligomer is a mixture of 35 to 55% of the functional group compound and three-functional-group compound.

3. A photoelectric converting device as set forth in claim 2, wherein said passivation film is made by heating and hardening said mixture at a temperature of 100° to 150° C.

4. A photoelectric converting device as set forth in claim 1, wherein said photoelectric converting means is a direct contact type image sensor formed on an elongated substrate.

5. A photoelectric converting device as set forth in claim 1, wherein said photoelectric converting means is a large-sized device formed on a substrate of a large area.

* * * * *